(12) United States Patent
Lin et al.

(10) Patent No.: US 9,620,208 B2
(45) Date of Patent: Apr. 11, 2017

(54) DEVICES AND METHODS FOR PROGRAMMING A RESISTIVE RANDOM-ACCESS MEMORY

(71) Applicant: Winbond Electronics Corp., Taichung (TW)

(72) Inventors: Lih-Wei Lin, Hsinchu (TW);
Tsung-Huan Tsai, Taichung (TW);
Chia-Hung Lin, Taichung (TW);
I-Hsien Tseng, Zhubei (TW); Ju-Chieh Cheng, Changhua County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/190,569

(22) Filed: Jun. 23, 2016

(65) Prior Publication Data
US 2017/0011798 A1    Jan. 12, 2017

(30) Foreign Application Priority Data

Jul. 7, 2015    (CN) .......................... 2015 1 0391984

(51) Int. Cl.
*G11C 11/00*    (2006.01)
*G11C 13/00*    (2006.01)
*G11C 5/14*    (2006.01)

(52) U.S. Cl.
CPC ...... *G11C 13/0069* (2013.01); *G11C 13/0002* (2013.01); *G11C 5/147* (2013.01)

(58) Field of Classification Search
CPC ............ G11C 13/0069; G11C 13/0004; G11C 13/0007; G11C 13/0002; G11C 5/147
USPC ................................... 365/148, 158, 189.09
See application file for complete search history.

(56) References Cited

U.S. PATENT DOCUMENTS 8,531,865 B2    9/2013    Hosono et al.
9,087,574 B2 *  7/2015    Close ................. G11C 13/0004

* cited by examiner

*Primary Examiner* — David Lam
(74) *Attorney, Agent, or Firm* — Muncy, Geissler, Olds & Lowe, P.C.

(57) ABSTRACT

A memory-programming device includes a voltage generator, a resistive random-access memory, a current detector, and a controller. The voltage generator is configured to generate a program voltage. The resistive random-access memory receives the program voltage to generate a program current. The current detector detects the program current. The controller executes a program procedure. The program procedure includes: gradually ramping up the program voltage by the voltage generator and detecting the program current by the current detector; discovering the maximum of the program current to be a reference current; continuing to ramp up the program voltage by the voltage generator and determining whether the program current detected by the current detector is not less than the reference current; controlling the voltage generator to stop generating the program voltage when the program current is not less than the reference current.

10 Claims, 3 Drawing Sheets

DEVICES AND METHODS FOR PROGRAMMING A RESISTIVE RANDOM-ACCESS MEMORY

CROSS REFERENCE TO RELATED APPLICATIONS

This application claims priority of China Patent Application No. 201510391984.5, filed on Jul. 7, 2015, the entirety of which is incorporated by reference herein.

BACKGROUND OF THE INVENTION

Field of the Invention

The disclosure relates generally to methods and devices for programming a memory, and more particularly it relates to methods and devices for resetting a resistive random-access memory.

Description of the Related Art

In integrated circuit (IC) devices, resistive random-access memory (RRAM) is an emerging technology for next-generation non-volatile memory devices. RRAM is a memory structure including an array of RRAM cells, each of which stores a bit of data using resistance values, rather than electronic charge. In particular, each RRAM cell includes a resistive material layer, the resistance of which can be adjusted to represent logic "0" or logic "1." RRAM devices operate under the principle that a dielectric, which is normally insulating, can be made to conduct through a filament or conduction path formed after the application of a sufficiently high voltage. The forming of a filament or conduction path is the forming operation or forming process of the RRAM. The sufficiently high voltage is the 'form' voltage.

The conduction path formation can arise from different mechanisms, including defects, metal migration, and other mechanisms. Various different dielectric materials may be used in RRAM devices. Once the filament or conduction path is formed, it may be reset, i.e. broken, resulting in high resistance, or set, i.e. reformed, resulting in lower resistance, by an appropriately applied voltage.

BRIEF SUMMARY OF THE INVENTION

In an embodiment, a memory-programming device comprises: a voltage generator, a resistive random-access memory, a current detector, and a controller. The voltage generator is configured to generate a program voltage. The resistive random-access memory receives the program voltage to generate a program current. The current detector detects the program current of the resistive random-access memory. The controller executes a program procedure, in which the program procedure comprises: gradually ramping up the program voltage by the voltage generator and detecting the program current by the current detector; discovering a maximum of the program current to be a reference current; continuously ramping up the program voltage by the voltage generator and determining whether the program current detected by the current detector is not less than the reference current; and controlling the voltage generator to stop generating the program voltage when the program current is not less than the reference current.

According to an embodiment of the invention, the step of gradually ramping up the program voltage by the voltage generator and detecting the program current by the current detector comprises: determining the program current detected by the current detector as a first current when the program voltage is a first voltage; storing the first current in the first register; and ramping up the first voltage by a predetermined increment using the voltage generator.

According to an embodiment of the invention, the step of discovering the maximum of the program current to be the reference current comprises: determining the program current detected by the current detector as a second current when the program voltage is a second voltage, wherein the second voltage is a sum of the first voltage and the predetermined increment; determining whether the second current is less than the first current; and setting the first current as the reference current and storing the reference current in a second register when the second current is less than the first current.

According to an embodiment of the invention, the step of discovering the maximum of the program current and setting it as the reference current further comprises: storing the second current in the first register when the second current is not less than the first current; and ramping up the second voltage with the predetermined increment by the voltage generator.

According to an embodiment of the invention, the program voltage is continuously ramped up by the voltage generator when the program current is less than the reference current.

In an embodiment, a memory-programming method, adapted for applying a program voltage to a resistive random-access memory to generate a program current, comprises: gradually ramping up the program voltage and detecting the corresponding program current; discovering a maximum of the program current to be a reference current; continuously ramping up the program voltage and determining whether the program current is not less than the reference current; and stopping generation of the program voltage when the program current is not less than the reference current.

According to an embodiment of the invention, the step of gradually ramping up the program voltage and detecting the corresponding program current comprises: determining the program current as a first current when the program voltage is a first voltage; storing the first current in a first register; and ramping up the first voltage with a predetermined increment.

According to an embodiment of the invention, the step of discovering the maximum of the program current to be the reference current comprises: determining the program current as a second current when the program voltage is a second voltage, wherein the second voltage is a sum of the first voltage and the predetermined increment; determining whether the second current is less than the first current; and setting the first current as the reference current and storing the reference current in a second register when the second current is less than the first current.

According to an embodiment of the invention, the step of discovering the maximum of the program current to be the reference current further comprises: storing the second current in the first register when the second current is not less than the first current; and ramping up the second voltage with the predetermined increment.

According to an embodiment of the invention, the program voltage is continuously ramped up when the program current is less than the reference current.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
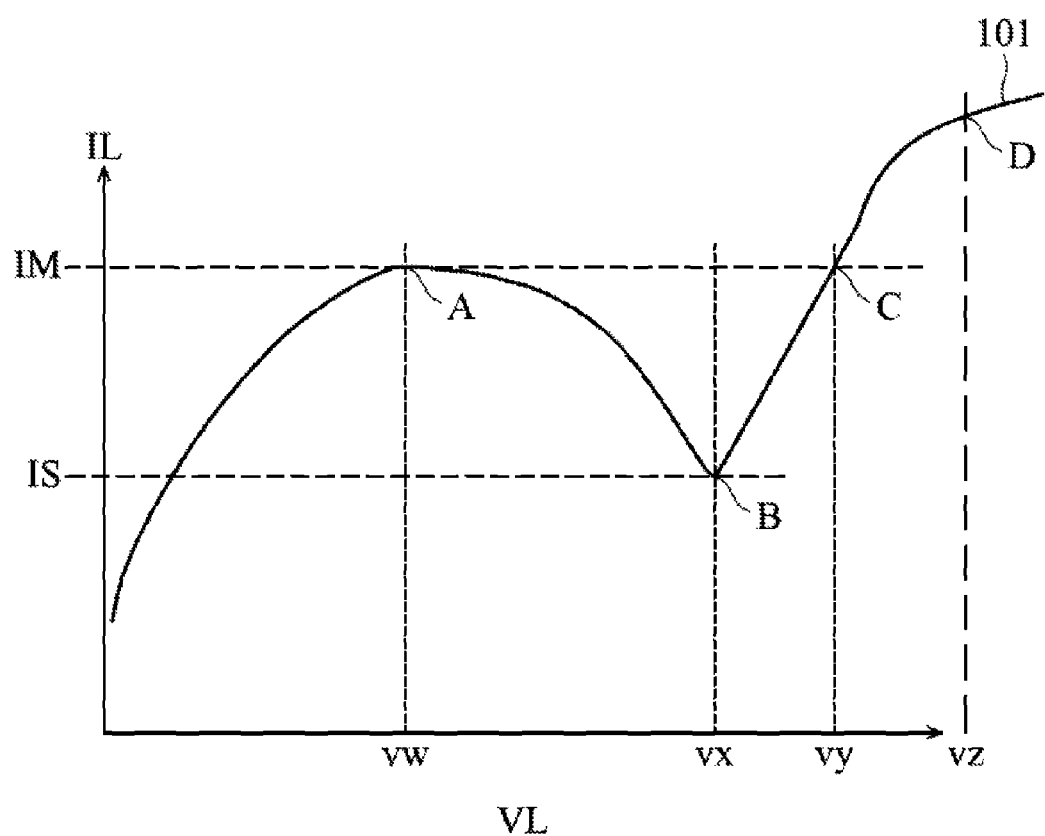
FIG. 1 is a curve diagram representing the relationship between the program current and the program voltage of a resistive random-access memory in accordance with an embodiment of the invention.

FIG. 1 is a curve diagram representing the relationship between the program current and the program voltage of a resistive random-access memory in accordance with an embodiment of the invention. As shown in FIG. 1, the programming curve 101 shows the relationship between the program voltage VL and the program current IL when a resistive random-access memory is in the reset operation, in which the program voltage VL is the reset voltage applied between the two electrodes of a resistive random memory, and the program current IL is the generated current when the program voltage VL is applied between two electrodes of the resistive random-access memory.

When resetting a resistive random-access memory, the program voltage VL is gradually ramped up from 0V. The program current IL flows when the program voltage VL is 0V, which means that the resistive random-access memory is in the low-resistance state. With the program voltage VL ramped up to the first voltage VW, the program current IL reaches the maximum current IM at the first state point A.

As shown by the programming curve 101, when the program voltage VL is continuously ramped up to the second voltage VX, the program current IL drops to the minimum current IS, which means that the resistive random-access memory is operated in the reset operation to break the filament, resulting in the resistance of the resistive random-access memory being increased. In addition, the resistive random-access memory reaches the high-resistance state at the second state point B.

When the resistive random-access memory is in the second state point B and the program voltage VL is continuously ramped up to the third voltage VY, the program current IL is proportional to the program voltage VL. That is, the resistive random-access memory follows the Ohm's Law between the second state point B and the third state point C. In addition, when the resistive random-access memory is in the third state point C, the program current IL reaches the maximum current IM once again.

In addition, since the program current IL is proportional to the program voltage VL after the resistive random-access memory is at the second state point B, the resistance variance of the resistive random-access memory operating between the second state point B and the third state point C is almost 0. In other words, the resistive random-access memory has been perfectly reset between the second state point B and the third state point C. That is, the filament has been broken, such that the resistive random-access memory is in the high-resistance state.

When the program voltage VL is continuously ramped up to the fourth voltage VZ to reach the fourth state point D, the relationship between the program current IL and the program voltage VL does not follow the Ohm's Law any more, and the resistance drops. At this moment, the resistance of the resistive random-access memory is laid between the high-resistance state and the low-resistance state, which is named over reset. Since the resistive random-access memory generates Joule heating due to the excessive reset voltage, thermal decomposition occurs on the oxygen surrounding the filament, such that the broken filament is reformed as another filament. At this moment, the resistance of the resistive random-access memory is complementary switching.

For accurately resetting the resistive random-access memory and preventing the resistive random-access memory from over reset, the maximum level of the program voltage VL should be limited, such that the resistive random-access memory is operated between the second state point B and the third state point C to achieve the best performance of the reset operation. If the resistive random-access memory is operated beyond the third state point C, the resistive random-access memory could be over reset. Therefore, the reset operation of the resistive random-access memory should be ended at the third state point C. That is, the program current IL should continuously detected, and the reset operation is immediately ended once the program current IL is not less than the maximum current IM.

Figure 2:
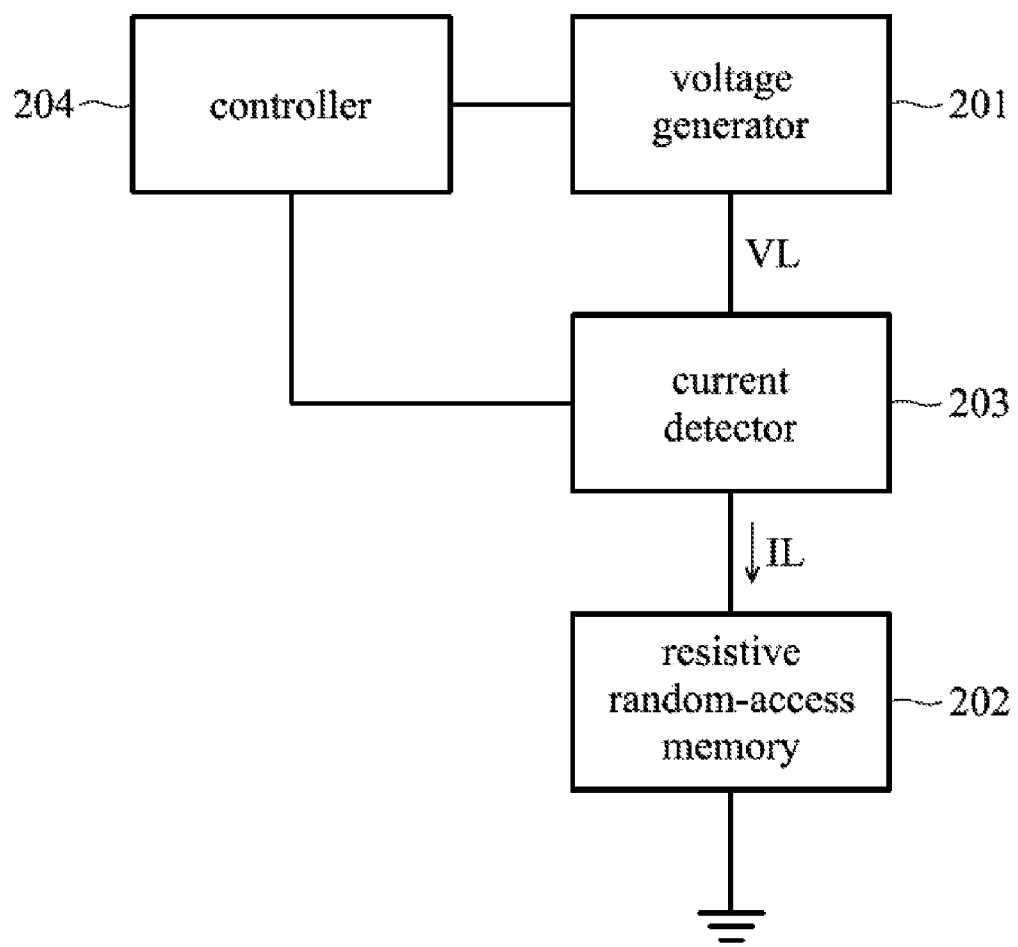
FIG. 2 is a block diagram of the memory-programming device in accordance with an embodiment of the invention.

FIG. 2 is a block diagram of the memory-programming device in accordance with an embodiment of the invention. As shown in FIG. 2, the memory-programming device 200 includes the voltage generator 201, the resistive random-access memory 202, the current detector 203, and the controller 204. The voltage generator 201 generates the program voltage VL for resetting the resistive random-access memory 202.

The resistive random-access memory 202 generates the program current IL according to the voltage across the program voltage VL, which is generated by the voltage generator 201, and the ground. The current detector 203 is configured to detect the program current IL generated by the resistive random-access memory 202. According to an embodiment of the invention, the voltage across the current detector 203 is 0V. That is, the program voltage VL generated by the voltage generator 201 is directly applied to the resistive random-access memory 202, and the voltage across the current detector 203 is neglected in the following description.

The controller 204 is configured to execute a program procedure. According to an embodiment of the invention, the program procedure is to perform the reset operation of the resistive random-access memory 202. According to another embodiment of the invention, the program procedure may include the reset operation and the set operation of the resistive random-access memory 202.

According to an embodiment of the invention, when performing the program procedure for executing the reset operation of the resistive random-access memory 202, the controller 204 controls the voltage generator 201 to gradually ramp up the program voltage VL and controls the current detector 203 to continuously detect the program current IL.

According to an embodiment of the invention, the controller 204 controls the voltage generator 201 to gradually ramp up the program voltage VL from 0V with a predetermined increment. According to an embodiment of the invention, the predetermined increment is 0.2V. According to another embodiment of the invention, the controller 204 controls the voltage generator 201 to continuously ramp up the program voltage VL with a slope of ramping up a predetermined increment in a predetermined period.

When the controller 204 determines that the program current IL reaches the maximum by the current detector 203, the maximum is determined as a reference current. That is, when the controller 204 determines that the resistive random-access memory 202 reaches the first state point A in FIG. 1 alone with the increasing of the program voltage VL, the controller 204 determines the maximum current IM in FIG. 1 as the reference current.

Then, the controller 204 controls the voltage generator 201 to continuously ramp up the program voltage VL and also determines whether the program current IL detected by the current detector 203 is not less than the reference current. When the program current IL detected by the current detector 203 is not less than the reference current (i.e., the program current IL exceeds, or is equal to, the reference current), it means that the resistive random-access memory 202 reaches the third state point C in FIG. 1, and the reset operation of the program procedure should be immediately ended. Therefore, the controller 204 controls the voltage generator 201 to stop generating the program voltage VL right away, so that the reset operation of the program procedure is ended right away. The details of the operational flow are described in the following paragraphs.

Figure 3:
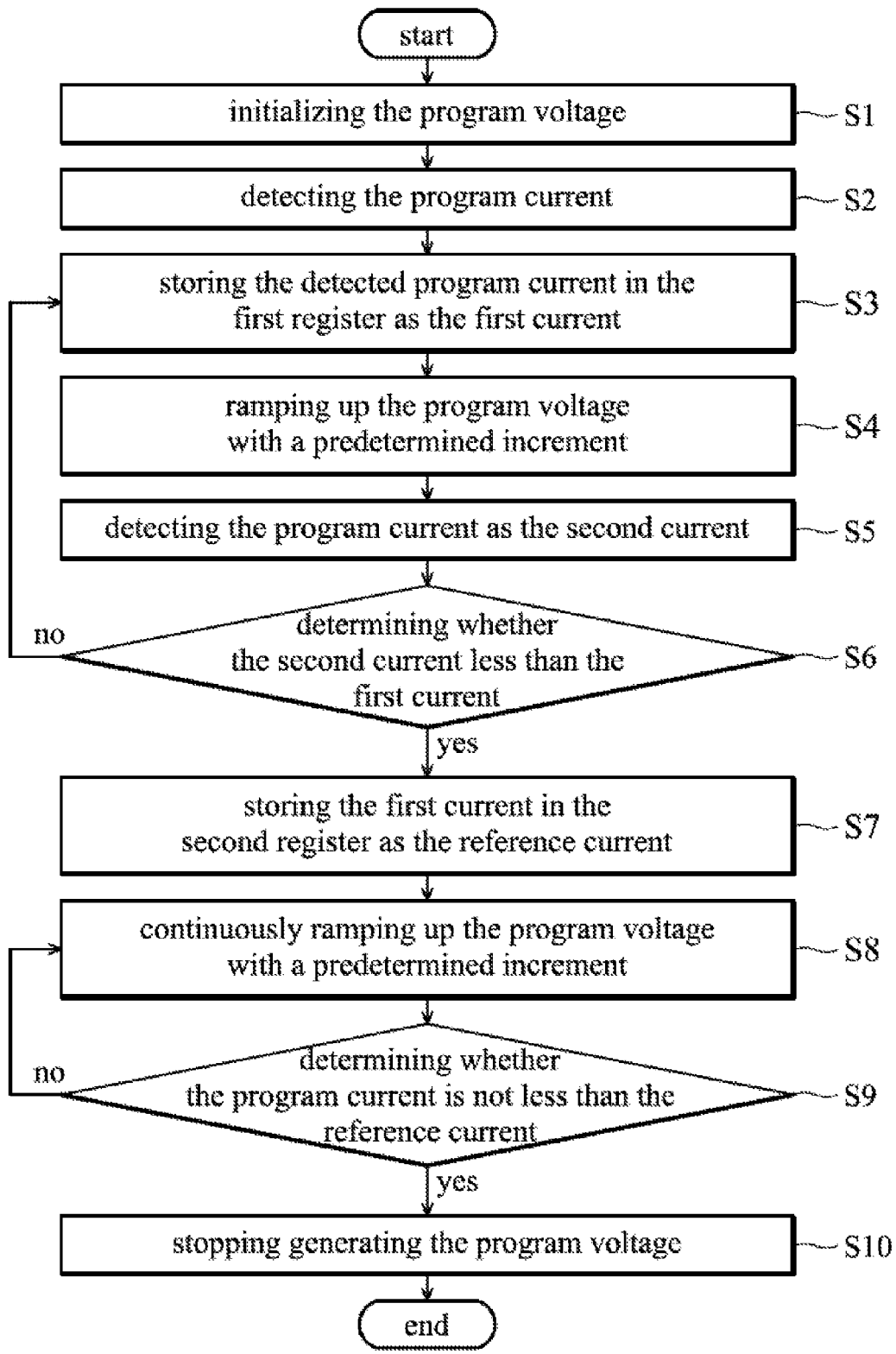
FIG. 3 is a flow chart of the memory-programming method in accordance with an embodiment of the invention.

FIG. 3 is a flow chart of the memory-programming method in accordance with an embodiment of the invention. According to an embodiment of the invention, the memory-programming method shown in FIG. 3 is adapted for performing the reset operation to a resistive random-access memory. The description of the flow chart in FIG. 3 will be described in detail with the block diagram shown in FIG. 2.

First, the controller 204 in FIG. 2 controls the voltage generator 201 to generate an initial value of the program voltage VL (Step S1) to operate the resistive random-access memory 202 in the reset operation. According to an embodiment of the invention, the initial value of the program voltage VL is 0V; according to another embodiment of the invention, the user is able to determine the initial value of the program voltage VL.

Then, the controller 204 controls the current detector 203 to immediately detect the program current IL generated by the resistive random-access memory 202 due to the program voltage VL (Step S2) and stores the detected program current IL in the first register (not shown in FIG. 2) as the first current (Step S3).

Then, the controller 204 ramps up the program voltage VL by a predetermined increment (Step S4). According to an embodiment of the invention, the predetermined increment is 0.2V. According to another embodiment of the invention, the controller 204 controls the voltage generator 201 to continuously ramp up the program voltage VL with a slope of ramping up the predetermined increment in a predetermined period.

The controller 204 controls the current detector 203 to detect the program current IL as the second current (Step S5), and controller 204 determines whether the second current is less than the first current (Step S6). According to an embodiment of the invention, the second current represents the program current IL detected at this moment, and the first current represents the program current IL detected in the previous moment. When the second current is less than the first current, it means that the program current IL detected at this moment is less than the program current IL detected in the previous moment. That is, the program current IL detected at this moment begins decreasing, and the program current IL detected in the previous moment (i.e., the first current) is the maximum current.

When the controller 204 determines that the second current is less than the first current, it means that the first current is the maximum current IM of the first state point A in FIG. 1. Therefore, the first current is stored in the second register (not shown in FIG. 2) as the reference current (Step S7).

Back to Step S6, when the controller 204 determines that the second current is not less than the first current, it means that the first state point A in FIG. 1 hasn't been reached. Therefore, the second current (i.e., the program current IL detected by the current detector 203) is stored in the first register to replace the first current, and the Step S3 to Step S6 are repeated until the maximum current IM of the first state point A in FIG. 1 is discovered.

Back to Step S7, when the maximum current IM of the first state point A in FIG. 1 is discovered and stored in the second register as the reference current, the controller 204 continuously ramps up the program voltage VL by a predetermined increment (Step S8). Then, the controller 204 determines whether the program current IL is not less than the reference current (Step S9). According to an embodiment of the invention, in Steps S7, S8, and S9, the resistive random-access memory 202 in FIG. 2 experiences a process of being converted from the low-resistance state to the high-resistance state.

In Step S9, when the program current IL is not less than the reference current, it means that the resistive random-access memory 202 is at the third state point C of FIG. 1. Once the resistive random-access memory 202 sustains a voltage over the program voltage VL of the third state point C, the resistive random-access memory 202 may enter the fourth state point D to be over reset, resulting in the non-ideal condition of complementary switching.

Therefore, when the controller 204 determines that the program current IL is not less than the reference current in Step S9, the controller 204 then controls the voltage generator 201 to stop generating the program voltage VL (Step S10). Back to Step S9, when the controller 204 determines that the program current IL is still less than the reference current, it means that the resistive random-access memory 202 has not reached the third state point C in FIG. 1 at this moment. Step S7 is repeated to ramp up the program voltage VL by a predetermined increment for properly resetting the resistive random-access memory 202.

According to an embodiment of the invention, the user may raise the program voltage to program the resistive random-access memory for improving the data retention of the resistive random-access memory. According to an embodiment of the invention, the resistive random-access memory programmed by a raised program voltage may be reset by the memory-programming method shown in FIG. 3. Therefore, the resistive random-access memory may be utilized by programming with a raised program voltage and the memory-programming method proposed in the invention to achieve the purpose of multi-time program e-Fuse.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A memory-programming device, comprising:
a voltage generator, configured to generate a program voltage;
a resistive random-access memory, receiving the program voltage to generate a program current;
a current detector, detecting the program current of the resistive random-access memory; and
a controller, executing a program procedure, wherein the program procedure comprises:
gradually ramping up the program voltage by the voltage generator and detecting the program current by the current detector;
discovering a maximum of the program current to be a reference current;
continuously ramping up the program voltage by the voltage generator and determining whether the program current detected by the current detector is not less than the reference current; and
controlling the voltage generator to stop generating the program voltage when the program current is not less than the reference current.

2. The memory-programming device of claim 1, wherein the step of gradually ramping up the program voltage by the voltage generator and detecting the program current by the current detector comprises:
determining the program current detected by the current detector as a first current when the program voltage is a first voltage;
storing the first current in the first register; and
ramping up the first voltage by a predetermined increment using the voltage generator.

3. The memory-programming device of claim 2, wherein the step of discovering the maximum of the program current to be the reference current comprises:
determining the program current detected by the current detector as a second current when the program voltage is a second voltage, wherein the second voltage is a sum of the first voltage and the predetermined increment;
determining whether the second current is less than the first current; and
setting the first current as the reference current and storing the reference current in a second register when the second current is less than the first current.

4. The memory-programming device of claim 3, wherein the step of discovering the maximum of the program current and setting it as the reference current further comprises:
storing the second current in the first register when the second current is not less than the first current; and
ramping up the second voltage with the predetermined increment by the voltage generator.

5. The memory-programming device of claim 1, wherein the program voltage is continuously ramped up by the voltage generator when the program current is less than the reference current.

6. A memory-programming method, adapted for applying a program voltage to a resistive random-access memory to generate a program current, comprising:
gradually ramping up the program voltage and detecting the corresponding program current;
discovering a maximum of the program current to be a reference current;
continuously ramping up the program voltage and determining whether the program current is not less than the reference current; and
stopping generation of the program voltage when the program current is not less than the reference current.

7. The memory-programming method of claim 6, wherein the step of gradually ramping up the program voltage and detecting the corresponding program current comprises:
determining the program current as a first current when the program voltage is a first voltage;
storing the first current in a first register; and
ramping up the first voltage with a predetermined increment.

8. The memory-programming method of claim 7, wherein the step of discovering the maximum of the program current to be the reference current comprises:
determining the program current as a second current when the program voltage is a second voltage, wherein the second voltage is a sum of the first voltage and the predetermined increment;
determining whether the second current is less than the first current; and
setting the first current as the reference current and storing the reference current in a second register when the second current is less than the first current.

9. The memory-programming method of claim 8, wherein the step of discovering the maximum of the program current to be the reference current further comprises:
storing the second current in the first register when the second current is not less than the first current; and
ramping up the second voltage with the predetermined increment.

10. The memory-programming method of claim 6, wherein the program voltage is continuously ramped up when the program current is less than the reference current.

* * * * *